United States Patent
Reusswig et al.

(10) Patent No.: US 9,646,709 B2
(45) Date of Patent: May 9, 2017

(54) PROXY WORDLINE STRESS FOR READ DISTURB DETECTION

(71) Applicant: SanDisk Technologies Inc., Plano, TX (US)

(72) Inventors: Philip Reusswig, Milpitas, CA (US); Harish Singidi, Milpitas, CA (US); Deepak Raghu, Milpitas, CA (US); Gautam Dusija, Milpitas, CA (US); Pao-Ling Koh, Milpitas, CA (US); Chris Avila, Milpitas, CA (US)

(73) Assignee: SanDisk Technologies, LLC, Plano, TX (US)

( * ) Notice: Subject to any disclaimer, the term of this patent is extended or adjusted under 35 U.S.C. 154(b) by 0 days.

(21) Appl. No.: 14/851,141

(22) Filed: Sep. 11, 2015

(65) Prior Publication Data
US 2017/0076811 A1    Mar. 16, 2017

(51) Int. Cl.
*G11C 16/04* (2006.01)
*G11C 16/34* (2006.01)
*G06F 11/10* (2006.01)
*G11C 29/52* (2006.01)
*G11C 16/26* (2006.01)
*G11C 11/56* (2006.01)

(52) U.S. Cl.
CPC ...... *G11C 16/3431* (2013.01); *G06F 11/1072* (2013.01); *G11C 11/5642* (2013.01); *G11C 16/26* (2013.01); *G11C 16/349* (2013.01); *G11C 29/52* (2013.01)

(58) Field of Classification Search
CPC ...... G11C 16/04; G11C 16/26; G11C 16/3431

USPC ........................................ 365/185.01–185.33
See application file for complete search history.

(56) References Cited

U.S. PATENT DOCUMENTS

| | | | | |
|---|---|---|---|---|
| 7,935,951 | B2* | 5/2011 | Czubatyj | H01L 45/085 257/2 |
| 8,269,208 | B2* | 9/2012 | Czubatyj | H01L 45/06 257/2 |
| 8,796,101 | B2* | 8/2014 | Czubatyj | H01L 45/06 257/2 |
| 8,942,043 | B2 | 1/2015 | Yuan et al. | |
| 2008/0035907 | A1* | 2/2008 | Czubatyj | H01L 45/085 257/4 |

(Continued)

OTHER PUBLICATIONS

International Search Report and Written Opinion, dated Sep. 20, 2016, 11 pgs., issued in International Patent Application No. PCT/US2016/036931, European Patent Office, Rijswijk, Netherlands.

(Continued)

*Primary Examiner* — Harry W Byrne
(74) *Attorney, Agent, or Firm* — Brinks Gilson & Lione

(57) ABSTRACT

Methods and systems are provided where non-volatile solid state memory may include selected memory cells coupled to a selected word line and proxy memory cells coupled to a proxy word line. The selected memory cells may be non-adjacent to the proxy memory cells and be selected for a read operation. A read proxy voltage may be applied to the proxy word line when data is read from the selected memory cells. A read disturb may be determined based on a difference between a predetermined value stored in the proxy memory cells and a value read from the proxy memory cells.

19 Claims, 5 Drawing Sheets

(56) References Cited

U.S. PATENT DOCUMENTS

| | | | |
|---|---|---|---|
| 2009/0225588 A1* | 9/2009 | Czubatyj | H01L 45/06 365/163 |
| 2011/0066902 A1 | 3/2011 | Sharon et al. | |
| 2012/0329237 A1* | 12/2012 | Czubatyj | H01L 45/06 438/382 |
| 2014/0136883 A1 | 5/2014 | Cohen | |
| 2014/0173239 A1 | 6/2014 | Schushan | |
| 2015/0135027 A1 | 5/2015 | Yanamanamanda et al. | |

OTHER PUBLICATIONS

Jim Cooke, "The Inconvenient Truths of NAND Flash Memory", dated Aug. 2007, pp. 1-32, Flash Memory Summit, Santa Clara, California.

* cited by examiner

PROXY WORDLINE STRESS FOR READ DISTURB DETECTION

TECHNICAL FIELD

This disclosure relates to non-volatile solid state memory and, in particular, to read disturb.

BACKGROUND

A multi-state flash memory cell is implemented by identifying multiple, distinct allowed threshold voltage ranges. Each distinct threshold voltage range corresponds to a predetermined value for the set of data bits. The specific relationship between data programmed into the memory cell and the threshold voltage ranges of the memory cell depends upon the data encoding scheme adopted for the memory cells.

Typically, a program voltage is applied to control gates of the memory cells as a series of pulses. The magnitude of the pulses may be increased with each successive pulse by a predetermined step size (for example, 0.2 volts, 0.3 volts, 0.4 volts, or any other voltage). In the periods between the pulses, verify operations may be carried out. That is, the programming level of each memory cell of a group of memory cells being programmed in parallel may be sensed between each programming pulse to determine whether the programming level of each memory cell is equal to or greater than a verify level to which the cell is being programmed. One way to verify the programming is to test conduction at a specific compare point. The memory cells that are verified to be sufficiently programmed are locked out, for example, by raising the bit line voltage to stop the programming process for those memory cells.

Memory cells can be read by separately applying one or more read compare voltages to the control gate (or other terminal) of a selected memory cell and sensing whether the selected memory cell conducts sufficient current in response to the read compare voltage. In these read operations, unselected word lines on memory cells neighboring the selected memory cell are raised to a read pass voltage (for example, 7 to 10 volts) in order to make the associated transistors operate as pass gates. In contrast to the neighboring word lines, the selected word line is coupled to a voltage, a level of which is specified for each read operation, in order to determine whether a threshold voltage of the concerned memory cell has reached such level. Because the unselected word lines receive the pass voltage, the memory cells on the unselected word lines during a read operation receive a voltage on their control gate, which over many read operations, may cause electrons to be injected into their floating gate, thereby raising the threshold voltage of those memory cells. This effect is called read disturb.

BRIEF DESCRIPTION OF THE DRAWINGS

The embodiments may be better understood with reference to the following drawings and description. The components in the figures are not necessarily to scale. Moreover, in the figures, like-referenced numerals designate corresponding parts throughout the different views.

DETAILED DESCRIPTION

Overview

Figure 1A:
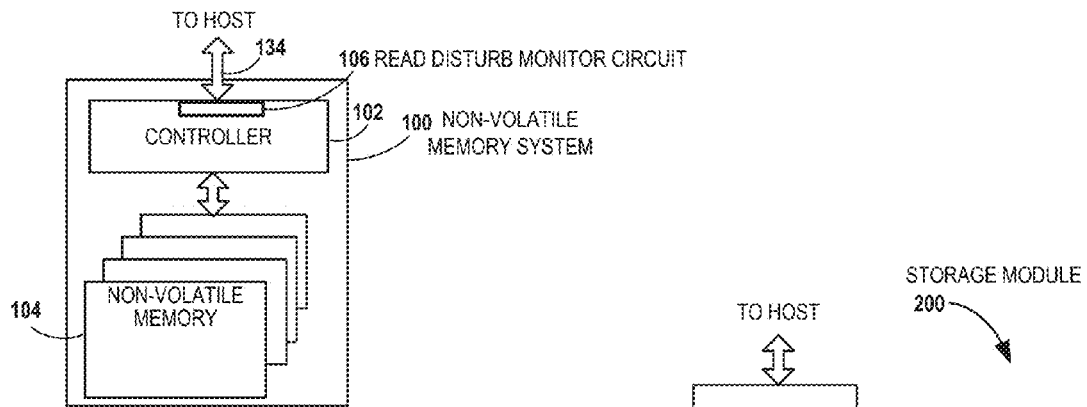
FIG. 1A is a block diagram of a non-volatile memory system of an embodiment.

By way of introduction, in one embodiment, a memory system may be provided that includes a non-volatile solid state memory and a memory controller. The non-volatile solid state memory may include selected memory cells coupled to a selected word line and proxy memory cells coupled to a proxy word line, where the selected memory cells are non-adjacent to the proxy memory cells. The memory controller may be configured to apply a read proxy voltage to the proxy word line when data is read from the selected memory cells. The memory controller may be configured further to determine a read disturb based on a difference between a predetermined value stored in the proxy memory cells and a value read from the proxy memory cells.

In another embodiment, a method for read disturb detection is provided. A predetermined value may be stored in a memory cell of a proxy word line of a block of non-volatile memory instead of host data. A read proxy voltage may be applied to a gate of the memory cell of the proxy word line if data is read from a selected memory cell of the block and the selected memory cell is not adjacent to the cell of the proxy word line. A read disturb of the block may be determined based on a comparison of the predetermined value with a value read from the memory cell of the proxy word line.

In yet another embodiment, a memory device may be provided that includes a non-volatile solid state memory and a read disturb determination module. The non-volatile solid state memory may include a selected memory cell coupled to a selected word line and a proxy memory cell coupled to a proxy word line. An unselected memory cell may be between the selected memory cell and the proxy memory cell. The selected memory cell may be selected for a read operation. The proxy memory cell may store a predetermined value instead of host data. The read disturb determination module may be configured to determine a read disturb based on a difference between the predetermined value stored in the proxy memory cell and a value read from the proxy memory cell, the value read from proxy memory after the read operation completes.

In some embodiments, the proxy word line is a last word line in a string to be programmed. In other embodiments, the proxy word line may be a dummy word line.

Other embodiments are possible, and each of the embodiments may be used alone or together in combination. Accordingly, various embodiments will now be described with reference to the attached drawings.

Exemplary Embodiments

Read disturb may be estimated by tracking the number of reads per block or page in a meta-block read counter. If the number of reads exceeds a threshold value, then read disturb may be detected. However, determining read disturb in this manner may erroneously detect read disturb in a block or page that has not yet actually experienced read disturb. This is because the threshold value may be chosen to be small enough to ensure that read disturb will be detected in blocks or pages that are particularly vulnerable to read disturb. This choice limits the possibility of read disturb occurring undetected. The downside, however, is that the endurance of the memory is adversely effected because the number of reads may indicate that read disturb is detected even when it has not actually occurred. In contrast, some embodiments described herein may avoid that disadvantage by actually detecting read disturb in the proxy memory cell or cells, which are coupled to a proxy word line.

Alternatively, read disturb may be detected by reading a significant portion of the memory, such as 50 percent of the total memory cells, and checking for errors that may have been caused by read disturb, for example by using error code correction. However, reading a significant portion of the memory to check for read disturb errors may have a significant negative performance impact because data is transferred out of the memory on the significant portion of the memory that is read and checked for errors. In contrast, some embodiments described herein may avoid that negative performance impact because only the memory cells coupled to the proxy read line may be read and checked for errors.

Figure 1B:
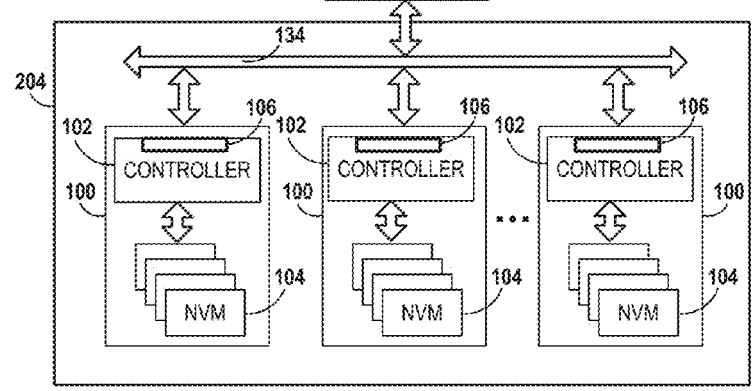
FIG. 1B is a block diagram illustrating an exemplary storage module of an embodiment.
Figure 1C:
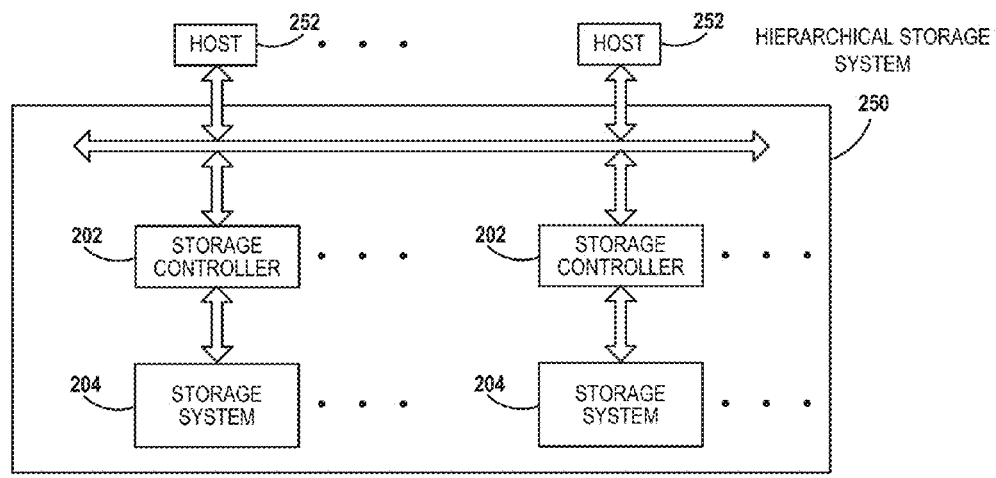
FIG. 1C is a block diagram illustrating a hierarchical storage system of an embodiment.

Memory systems suitable for use in implementing aspects of these embodiments are shown in FIGS. 1A-1C. FIG. 1A is a block diagram illustrating a non-volatile memory system according to an embodiment of the subject matter described herein. Referring to FIG. 1A, the non-volatile memory system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. The controller 102 interfaces with a host system and transmits command sequences for read, program, and erase operations to non-volatile memory die 104. Examples of the host system may include, for example, a mobile phone, a tablet computer, a digital media player, a game device, a personal digital assistant (PDA), a mobile (for example, notebook, laptop) personal computer (PC), a book reader, or any other processing device.

The controller 102 (which may be a flash memory controller or any other memory controller) may be in the form of processing circuitry, such as a microprocessor or a processor, and a computer-readable medium that stores computer-readable program code (for example, firmware) executable by the processing circuitry. The controller 102 may include a (micro)processor, logic gates, switches, an application specific integrated circuit (ASIC), a programmable logic controller, and/or an embedded microcontroller, for example. The controller 102 may be configured with hardware and/or firmware to perform the various functions described below and shown in the flow diagrams. The controller 102 may include a read disturb monitor circuit 106. Alternatively or in addition, some of the components, such as the read disturb monitor circuit 106, which is shown as being internal to the controller 102, may be external to the controller.

As used herein, a flash memory controller may be a device that manages data stored on flash memory and communicates with the host system (alternatively referred to herein as a host), such as a computer or electronic device. A flash memory controller may have functionality in addition to the specific functionality described herein. For example, the flash memory controller may format the flash memory to ensure the memory is operating properly, map out bad flash memory cells, and allocate spare cells to be substituted for future failed cells. Some part of the spare cells may be used to hold firmware to operate the flash memory controller and implement other features. In operation, when a host needs to read data from or write data to the flash memory, the host will communicate with the flash memory controller. If the host provides a logical address to which data is to be read and/or written, the flash memory controller may convert the logical address received from the host to a physical address in the flash memory. (Alternatively, the host may provide the physical address.) The flash memory controller may also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block may be erased and reused).

The non-volatile memory die 104 may include any suitable non-volatile storage medium, including NAND flash memory cells and/or NOR flash memory cells. The memory cells may take the form of solid-state (such as flash) memory cells and may be one-time programmable, few-time programmable, or many-time programmable. The memory cells may also be single-level cells (SLC), multiple-level cells (MLC), triple-level cells (TLC), or use other memory cell level technologies, now known or later developed. Also, the memory cells may be fabricated in a two-dimensional or three-dimensional fashion.

The interface between controller 102 and non-volatile memory die 104 may be any suitable flash interface, such as Toggle Mode 200, 400, or 800. In one embodiment, the memory system 100 may be a card based system, such as a secure digital (SD) or a micro secure digital (micro-SD) card. In an alternate embodiment, the memory system 100 may be part of an embedded memory system.

Although, in the example illustrated in FIG. 1A, the non-volatile memory system 100 (alternatively referred to herein as a storage module) includes a single channel between the controller 102 and the non-volatile memory die 104, the subject matter described herein is not limited to having a single memory channel. For example, in some NAND memory system architectures like the ones in FIGS. 1B, 1C, and 2, more NAND channels may exist between the controller 102 and the non-volatile memory die 104, depending on controller capabilities. In any of the embodiments described herein, more than a single channel may exist between the controller 102 and the memory die 104, even if a single channel is shown in the drawings.

The controller 102 may be operatively in communication with the host system over a bus 134. The phrase "operatively in communication with" may mean directly in communication with or indirectly (wired or wireless) in communication with through one or more components, which may or may not be shown or described herein.

The bus 134 may be a system that transfers data between components, such as between the controller 102 and a host. In some examples, the bus 134 may include related hardware components, such as wire and/or optical fiber, and software. The bus 134 may include parallel electrical wires over which electronic signals propagate. Examples of the bus 134 may include, an Ultra High Speed (UHS) bus, an Ultra High Speed, Phase I (UHS-I) bus, an Ultra High Speed, Phase II (UHS-II) bus, a Secure Digital (SD) bus, a Secure Digital High Capacity (SDHC) bus, a Secure Digital eXtended Capacity (SDXC) bus, a Universal Serial Bus (USB), a serial advanced technology attachment (SATA) bus, a peripheral component interface express (PCIe) bus, or any other type of bus.

FIG. 1B illustrates a storage module 200 that includes multiple non-volatile memory systems 100. As such, the storage module 200 may include a storage controller 202 that interfaces with a host and with storage system 204, which includes multiple non-volatile memory systems 100. The multiple non-volatile memory systems 100 may be operably in communication with the storage module 200 over the bus 134. The interface between storage controller 202 and non-volatile memory systems 100 may be a bus interface, such as a serial advanced technology attachment (SATA) or peripheral component interface express (PCIe) interface. The storage module 200, in one embodiment, may be configured as a solid state drive (SSD), which may be configured in portable computing devices, such as laptop computers, and tablet computers.

As illustrated in FIG. 1B, each of the controllers 102 of the non-volatile memory systems 100 may include the read disturb monitor circuit 106. Alternatively or in addition, the storage controller 202 that interfaces with the host may include the read disturb monitor circuit 106.

FIG. 1C is a block diagram illustrating a hierarchical storage system 250. The hierarchical storage system 250 may include multiple storage controllers 202, each of which controls a respective storage system 204. Host systems 252 may access memories within the storage system 250 via a bus interface. In one embodiment, the bus interface may be an NVMe or fiber channel over Ethernet (FCoE) interface. In one embodiment, the system 250 illustrated in FIG. 1C may be a rack mountable mass storage system that is accessible by multiple host computers, such as would be found in a data center or other location where mass storage is needed.

Each of the storage controllers 202 may include a corresponding read disturb monitor circuit 106 (not shown). Alternatively or in addition, each respective storage system 204 may include one or more corresponding read disturb monitor circuits 106 as shown in FIG. 1B.

Figure 2:
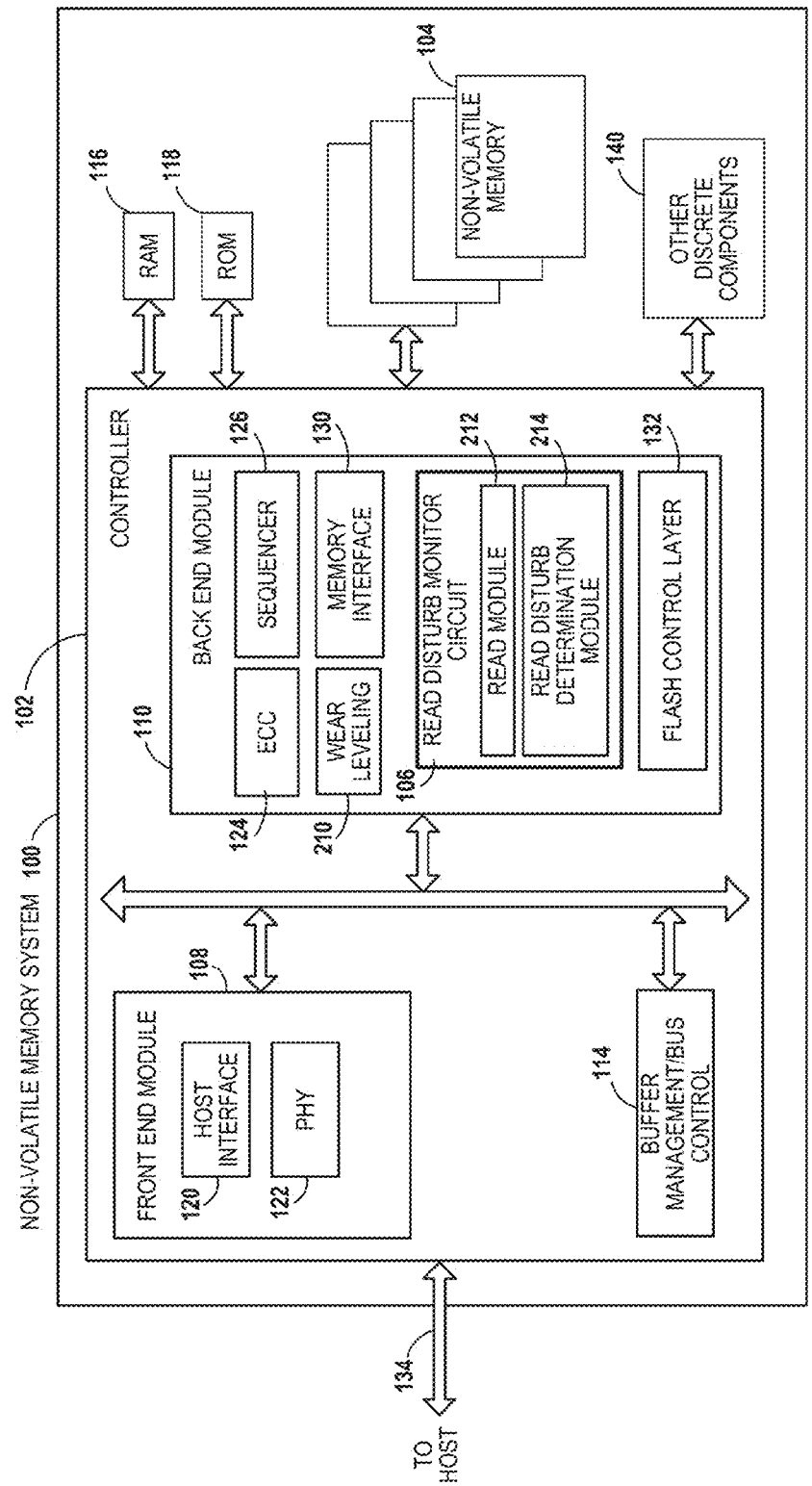
FIG. 2 is a block diagram illustrating exemplary components of the controller of the non-volatile memory system illustrated in FIG. 1A according to an embodiment.

FIG. 2 is a block diagram illustrating exemplary components of controller 102 in more detail. The controller 102 may include a front end module 108 that interfaces with a host over the bus 134, a back end module 110 that interfaces with the one or more non-volatile memory die 104, and various other modules that perform functions which will now be described in detail.

Modules of the controller 102 may include the read disturb monitor circuit 106. Another module of the controller 102 may be a buffer manager/bus controller 114 that manages buffers in random access memory (RAM) 116 and controls the internal bus arbitration of controller 102. A read only memory (ROM) 118 stores system boot code. Although illustrated in FIG. 2 as located separately from the controller 102, in other embodiments one or both of the RAM 116 and ROM 118 may be located within the controller. In yet other embodiments, portions of RAM and ROM may be located both within the controller 102 and outside the controller.

The front end module 108 may include a host interface 120 and a physical layer interface (PHY) 122 that provide the electrical interface with the host or next level storage controller. The choice of the type of host interface 120 may depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

The back end module 110 may include the read disturb monitor circuit 106 and other modules, such as a wear leveling module 210, an error correction controller (ECC) engine 124, a command sequencer 125, a memory interface 130, and a flash control layer 132. The ECC engine 124 may encode the data bytes received from the host, and decode and error correct the data bytes read from the non-volatile memory, which includes the non-volatile memory die 104. The command sequencer 126 may generate command sequences, such as program and erase command sequences, to be transmitted to the non-volatile memory die 104. The memory interface 130 provides the command sequences to the non-volatile memory die 104 and receives status information from the non-volatile memory die 104. In one embodiment, the memory interface 130 may be a double data rate (DDR) interface, such as a Toggle Mode 200, 400, or 800 interface. The flash control layer 132 may control the overall operation of the back end module 110. The wear leveling module 210 may arrange data so that erasures and re-writes are distributed more evenly across the non-volatile memory than without wear leveling. By distributing the erasures and re-writes, the wear leveling module 210 may limit the possibility that a single erase block prematurely fails due to a high concentration of write cycles.

The non-volatile memory system 100 may include other discrete components 140, such as external electrical interfaces, external RAM, resistors, capacitors, or other components that may interface with the controller 102. In alternative embodiments, one or more of the physical layer interface 122 and buffer management/bus controller 114 are optional components that are not necessary included in the controller 102.

The read disturb monitor circuit 106 may be a circuit that detects read disturb by applying a read disturb proxy voltage (or simply "read proxy voltage") to one or more proxy memory cells (not shown) when read operations occur, and subsequently detecting read disturb based on a difference between a predetermined value stored in the proxy memory cell(s) and a value read from the proxy memory cell(s). The read disturb monitor circuit 106 may include, for example, a read module 212 and a read disturb determination module 214. The read module 212 may apply the read proxy voltage to the proxy memory cell(s) when read operations occur. The read disturb determination module 214 may detect read disturb based on the difference between the predetermined value stored in the proxy memory cell(s) and the value read from the proxy memory cell(s).

Figure 3:
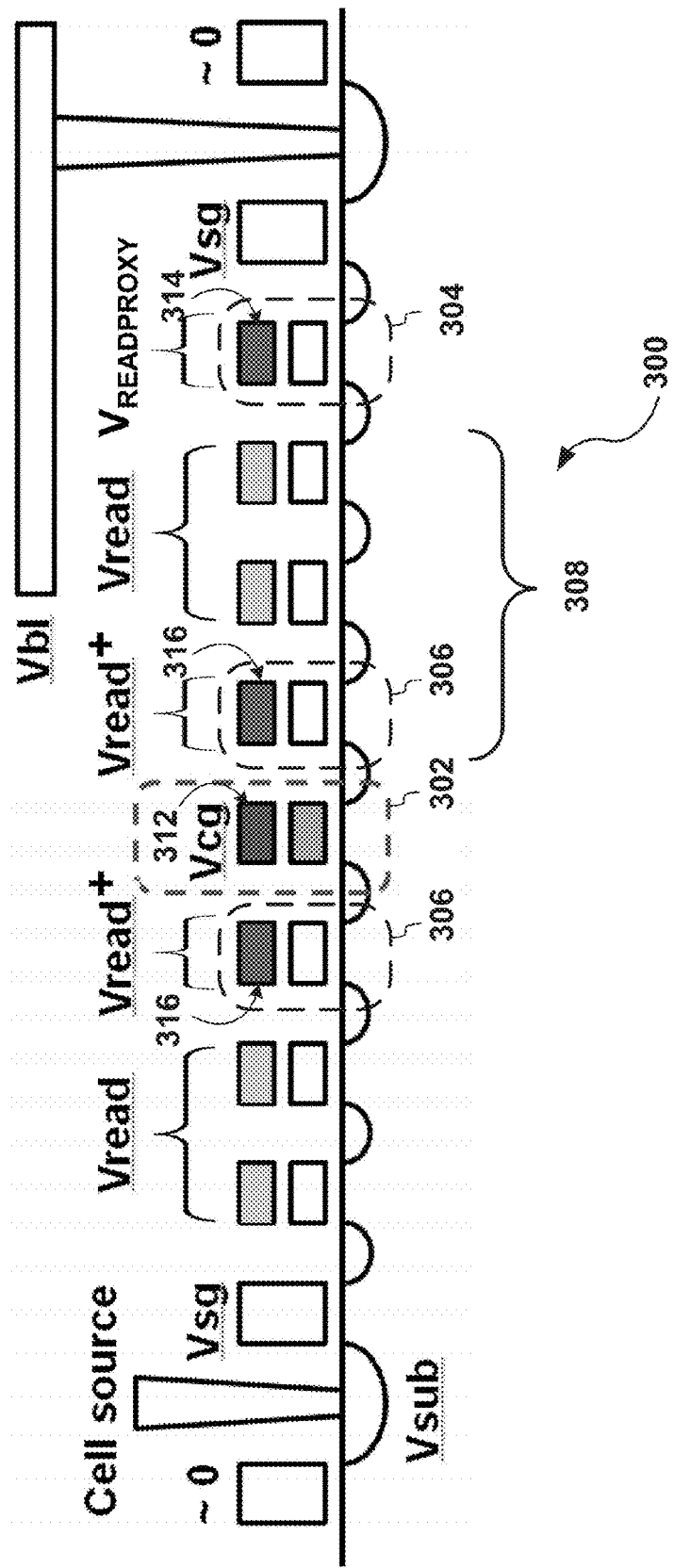
FIG. 3 illustrates memory cells of non-volatile memory including a proxy memory cell.

Referring to FIG. 3, non-volatile memory 300, such as the non-volatile memory die 104, may include a selected memory cell 302, unselected memory cells 306 adjacent to the selected memory cell 302, and a proxy memory cell 304 that is non-adjacent to the selected memory cell 302. The selected memory cell 302 may be any cell that is to be read in a read operation. Depending on which cells have been programmed, the non-volatile memory 300 may or may not include unprogrammed memory cells 308 between the selected memory cell 302 and the proxy memory cell 304.

The proxy memory cell 304 may be a memory cell that stores a predetermined value instead of host data. As explained in more detail below, the proxy memory cell 304 may also store host data in some examples. The proxy memory cell 304 may be, for example, a dummy memory cell in a dummy word line or a memory cell in the last word line in a string to be programmed. Memory cells in a dummy word line may be cells used to decrease noise in reading and/or writing. The last word line in a string to be programmed may be, for example, a word line having a highest index in a page of memory, where the page of memory is a smallest unit of memory that may be programmed at once. Alternatively or in addition, the last word line a string to be programmed may be a word line having a highest index in a block of memory. The proxy memory cell 304 may be alternatively referred to herein as "read proxy memory cell."

The selected memory cells 302 may be coupled to a selected word line 312, the unselected memory cells 306 may be coupled to unselected word lines 316, and the proxy memory cells 304 may be coupled to a proxy word line 314. The proxy word line 304 may be alternatively referred to herein as "read proxy word line." In FIG. 3, each of the selected memory cells 302, the proxy memory cells 304, and the unselected memory cells 306 is represented by two rectangles, one on top of the other. The top rectangle represents the word line 312, 314, and 316. The bottom rectangle represents the floating gate where charge is stored and removed.

During operation of the system 100, the selected memory cell 302 may be read. When the selected memory cell 302 is read, the read module 212 may apply a read compare voltage (Vcg) to a gate of the selected memory cell 302 via the selected word line 312. The read module 212 may apply a read pass voltage (Vread+) to gates of the unselected memory cells 306 adjacent to the selected memory cell 302. The read pass voltage may be higher than the read compare voltage and may help contribute to read disturb.

In order to emulate the potential effect that applying the read pass voltage to the unselected memory cells 306 may have had, the read module 212 may apply a read proxy voltage (Vreadproxy) to a gate of the proxy memory cell 304 via the proxy word line 314. The read proxy voltage may be substantially the same as the read pass voltage that is applied to the unselected memory cells 306. The read proxy voltage may be considered substantially the same as the read pass voltage if either of the voltages is within 15 percent of the other. In some examples, the read proxy voltage may be greater than or equal to the read pass voltage. Alternatively or in addition, the read proxy voltage may be less than the read pass voltage but greater than the read compare voltage.

For each read of the selected memory cell 302 or other cell in the page or block, the read module 212 may apply the read proxy voltage to the gate of the proxy memory cell 304 via the proxy word line. As a result, the proxy memory cell 304 may be at least as affected by read disturb as any of the memory cells adjacent to selected memory cells that were subjected to the read pass voltage.

Prior to the read module 212 applying the read proxy voltage to the gate of the proxy memory cell 304, the read disturb determination module 214 or other module may have stored the predetermined value in the proxy memory cell 304. For example, the block containing the proxy memory cell 304 may have been erased or otherwise programmed. The predetermined value may be zero, one, or any other value.

After the read module 212 has applied the proxy voltage to the gate of the proxy memory cell 304, the read disturb determination module 214 may determine the read disturb based on a difference between the predetermined value stored in the proxy memory cell 304 and a value read from the proxy memory cell 304. If the difference exceeds a threshold value, then the read disturb determination module 214 may determine that read disturb has been detected. In other words, read disturb may be determined based on the difference exceeding a threshold.

In one example, if the predetermined value is zero, then read disturb may be detected if the number of non-zero bits in the value read from the proxy memory cell 304 exceeds a threshold number of bits. The threshold number of bits may be zero, one, or any other desired threshold value. More generally, the difference may be the number of bits that differ between the predetermined value and the value read from the proxy memory cell 304.

In another example, the read disturb determination module 214 may apply error code correction (ECC) to the value read to arrive at a corrected value. If the difference between the corrected value and the predetermined value exceeds a threshold amount, then read disturb may be detected. Alternatively or in addition, if the error code correction indicates that more than a threshold number of bits were corrected, then read disturb may be detected. In other words, the difference may be the error correction code. Accordingly, the read disturb may be determined based on a comparison of the predetermined value with the value read from the proxy memory cell 304.

The read disturb may be determined based on one or more factors in addition to the difference between the predetermined value stored in the proxy memory cells and a value read from the proxy memory cell 304. One such factor may include a program and erase (PE) cycle count. In one example, the threshold value may be a function of the PE cycle count of the block. The higher the PE cycle count of the block, the more likely that the memory cells of the block may be susceptible to read disturb. Accordingly, the threshold value for the difference between the predetermined value stored in the proxy memory cell 304 and the value read from the proxy memory cell 304 may decrease as the PE cycle count for the block increases.

An open block is a block of memory in which not all word lines of memory cells for host data are programmed. In contrast, a closed block is a block of memory in which all word lines of memory cells for host data are programmed. As a block is programmed, data may be added sequentially starting with memory cells on the lowest indexed word line and ending with memory cells on the highest indexed word line. The unprogrammed cells on open blocks include erased memory cells and, as a result, typically have states at voltages that are lower than memory cells on the programmed word lines. As a result, open blocks may be more sensitive to read disturb than closed blocks.

In some examples, the read module 212 may not apply the read proxy voltage to the gate of the proxy memory cell 304 for every read of the selected memory cell 302. In a first such example, the read module 212 may apply the read proxy voltage if the block containing the selected memory cell 302 is an open block, but not when the block is a closed block. In a second such example, the read module 212 may apply the read proxy voltage if the selected memory cell 302 is on a border word line but not otherwise. Memory cells on a border word line may be programmed but memory cells on an adjacent word line are not programmed.

Figure 4:
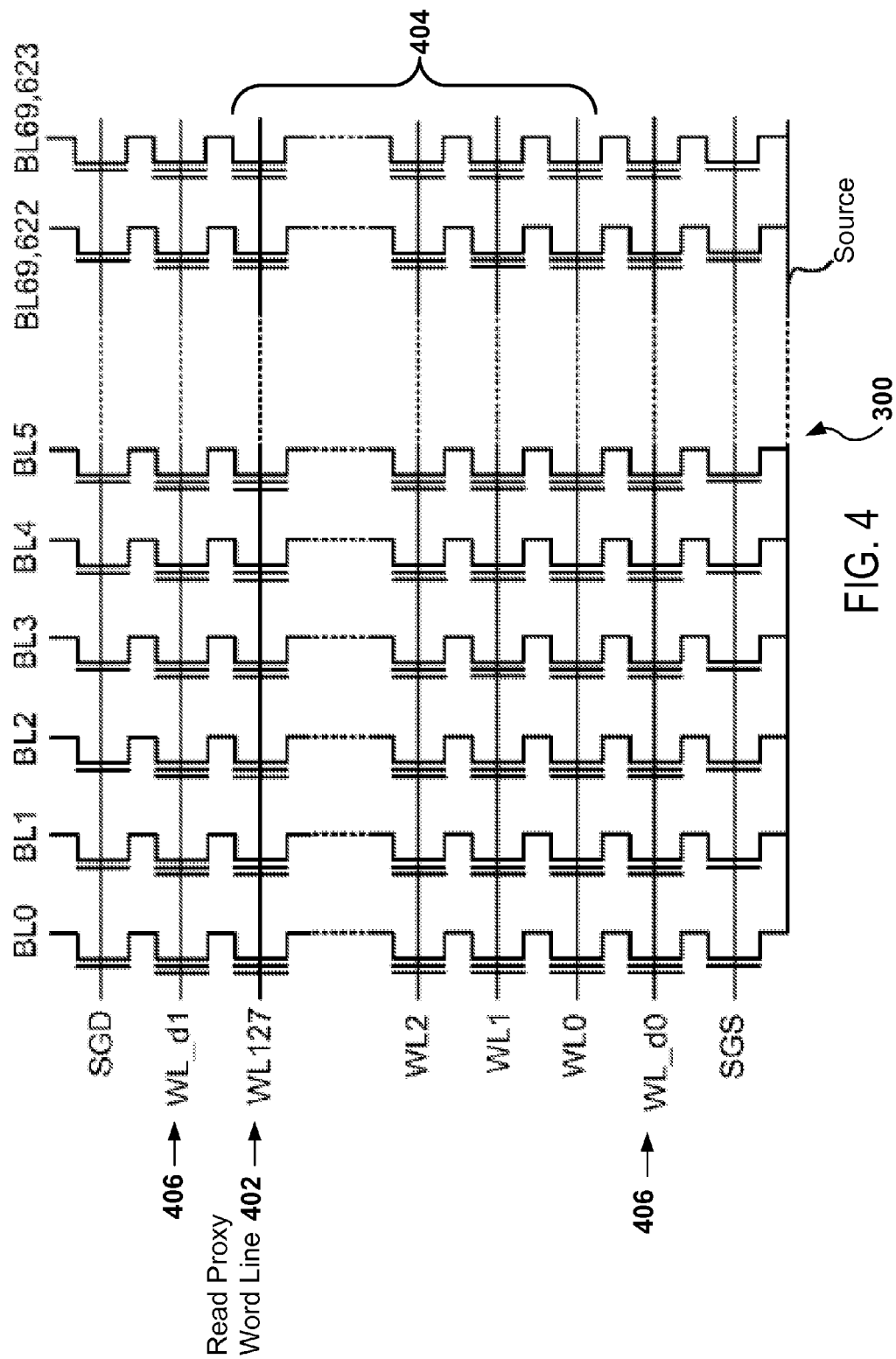
FIG. 4 illustrates word lines in a block of non-volatile memory, where a read proxy word line is coupled to memory cells in the last word line in a string to be programmed.

FIG. 4 illustrates word lines, 402, 404, and 406, in a block of the non-volatile memory 300, where a read proxy word line 402 is coupled to memory cells in the last word line in a string to be programmed. In the example illustrated in FIG. 4, word lines 404 of memory cells for host data are indexed from 0 to 127. The block of non-volatile memory 300 includes dummy word lines 406. The word lines, 402, 404, and 406, are coupled to corresponding gates of transistors in the memory cells. Each transistor illustrated in FIG. 4 that has a gate coupled to any of the word lines 404 for host data stores state for a corresponding memory cell.

The detection of the read disturb may be used for any purpose. In a first example, read disturb detection may be used to determine whether to blindly copy or whether to error correct when wear leveling. The wear leveling module 210 may move data from a first block to a second block in order to limit overuse of the first block. The wear leveling module 210 may blindly copy data from the first block to the second block if the read disturb monitor circuit 106 does not detect read disturb in the first block. On the other hand, the wear leveling module 210 may perform error correction code on the data read from the first block before copying the data to the second block if the read disturb monitor circuit 106 detects read disturb in the first block.

In a second example, the read disturb detection may indicate how frequently a block is read. If read disturb is detected in a block then a determination may be made that the amount of times the block has been read exceeds a threshold amount. Alternatively, if read disturb is not detected in the block, then a determination may be made that the block has been read from less than the threshold amount. Accordingly, the read disturb detection may indicate whether data in a single level cell is to be moved without ECC correction to a triple-level or multi-level cell. More generally, the read disturb detection may indicate whether data in one type of cell is to be moved with or without ECC correction to another type of cell.

In a third example, the detection of read disturb in a block may indicate an issue with the health of the block. Therefore, a health indicator, which may indicate how healthy a block of memory is, may be a function of whether read disturb was detected in the block of memory. The health indicator may be a function of additional other factors such PE cycle count and/or any other information that may indicate the health of the block.

In one example, the read proxy word line 402 may be the dummy word line 406 on the drain or source side of a block of single-level memory (X1). The read proxy word line 402, which in this example is the dummy word line 406, is erased. When erased, memory cells on the read proxy word line 402 may be set to all ones. On any open block read, the read module 212 may apply the read proxy voltage to the read proxy word line 402. During a read scan, the wear leveling module 210 may count the number of zeros read from the memory cells on the read proxy word line 402. If the number of zeros is above a threshold, then the read proxy word line 402 may no longer be considered erased. Accordingly, the wear leveling module 210 may read the read proxy word line 402 during the read scan, and detect read disturb if the number of zeros exceeds the threshold. If the number of zeros exceeds the threshold value thereby indicating read disturb, then the wear leveling module 210 may fold the data from the block of single-level memory into a block of memory that is triple or multi-level. On the other hand, if the number of zeros fails to exceed the threshold indicating no read disturb, then the wear leveling module 210 may copy the data from the block of single-level memory to another block of single-level memory. The threshold may be one, two, or any other value.

In a second example, the read proxy word line 402 may be the last unprogrammed word line, WL127, of a block of single-level memory (X1). On any open block read, the read module 212 may apply the read proxy voltage to the read proxy word line 402. Prior to closing the block by writing host data to the memory cells on the read proxy word line 402, a write module (not shown) of the controller 102 or other module may count the number of zeros stored in the cells on the read proxy word line 402. If the measured number of zeros exceeds a threshold value indicating read disturb is detected, then the write module may copy the data in the block of single-level memory to another block of single-level memory. Alternatively, if the measured number of zeros fails to exceed the threshold value thereby indicating read disturb is not detected, then the block may be closed by writing host data to the memory cells on the read proxy word line 402.

In a third example, the read proxy word line 402 may be a dummy word line of a block of single-level memory (X1). The block of single-level memory, including the dummy word line, may be erased. On any block read, the read module 212 may apply the read proxy voltage to the read proxy word line 402, which is the dummy word line in this example. The wear leveling module 210 or any other module may count the number of zeros read from the memory cells on the read proxy word line 402. If the number of zeros is above a threshold, then the read proxy word line 402 may no longer be considered erased. Accordingly, the wear leveling module 210 or other module may read the read proxy word line 402 during a read scan, and detect read disturb if the number of zeros exceeds the threshold. If the number of zeros exceeds the threshold value indicating read disturb, then the wear leveling module 210 may fold the data from the block of single-level memory into a block of memory that is triple or multi-level. On the other hand, if the number of zeros fails to exceed the threshold thereby indicating no read disturb, then the wear leveling module 210 may copy the data from the block of single-level memory to another block of single-level memory.

The non-volatile memory 300 may include single-level cells. Alternatively or in addition, the non-volatile memory 300 may include triple-level cells. Alternatively or in addition, the non-volatile memory 300 may include multi-level cells.

Although the selected memory cell 302 and the proxy memory cell 304 are sometimes referred to in the singular herein, the related discussion may refer to multiple selected memory cells or multiple proxy memory cells.

The proxy word line 402 may be indicative of read disturb for a block. A worst case usage scenario for a block may be if all user reads are performed on a single word line. Accordingly, the threshold number of zeros or other parameter of the read disturb monitor circuit 106 may be tuned to single page read disturb.

The non-volatile memory system 100 may include a memory device. The memory device may be in any form that includes the non-volatile memory 300. For example, the memory device may be in the form of a memory card for solid-state storage, such as MultiMediaCard (MMC), embedded card (eMMC), Secure Digital (SD), RS-MMC, MMCplus, MMCmobile, SecureMMC, SDIO SD, miniSD, and microSD. Alternatively or in addition, the memory device may be in the form of a flash drive, a universal serial bus (USB) drive, or any other a solid state storage device. Alternatively or in addition, the memory device may include a printed circuit board (PCB) card that comprises non-volatile solid state memory.

The non-volatile solid state memory may be any semiconductor memory that maintains state when power is disconnected from the semiconductor memory. Examples of the non-volatile solid state memory may include non-volatile memory such as resistive random access memory ("ReRAM"), electrically erasable programmable read only memory ("EEPROM"), flash memory (which may also be considered a subset of EEPROM), ferroelectric random access memory ("FRAM"), and magnetoresistive random access memory ("MRAM"), and other semiconductor elements capable of storing information. Each type of the non-volatile solid state memory may have different configurations. For example, flash memory may be configured in a NAND or a NOR configuration.

The word lines 402, 404, and 406 may be coupled to gates of transistors. The term "coupled" may mean physically coupled and/or electrically coupled.

Figure 5:
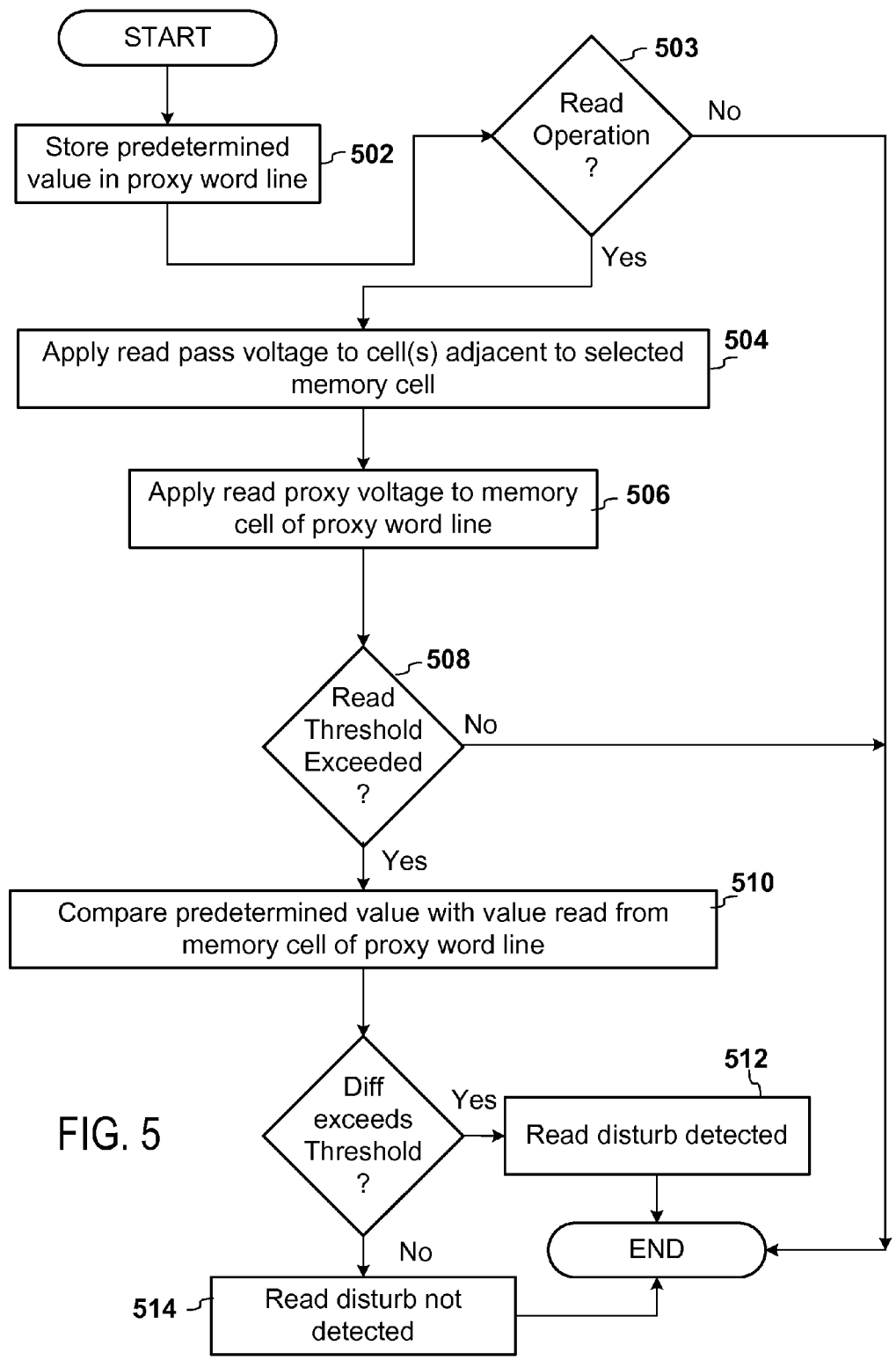
FIG. 5 illustrates a flow diagram of logic of a system to determine read disturb.

FIG. 5. Illustrates a flow diagram of logic of a system to determine read disturb. The system may include fewer, additional, or different operations than illustrated in FIG. 5. The operations may be performed in a different order than illustrated.

Operations may begin in an operation in which a predetermined value may be stored (502) in the memory cell of the proxy word line of a block of non-volatile memory instead of host data. For example, the memory cell may be erased or some other pattern may be stored in the memory cell or memory cells on the proxy word line.

If a memory or disk operation is to be performed, the operation may be checked (503) to see if the operation is a read operation. If the operation is not a read operation, then operations may end. Alternatively, if a read operation is to be performed on the block, then a read pass voltage may be applied (504) to a selected memory cell to be read. In addition, if a read operation is to be performed on the block, a read proxy voltage may be applied (506) to a gate of the memory cell of the proxy word line. The read proxy voltage may be applied before, after, and/or concurrently with the application of the read pass voltage to the selected memory cell to be read. In other words, each time a read operation is performed on the block, the read proxy voltage may be applied to the proxy word line. Alternatively, if the operation is not a read operation, then operations may end.

For each read operation, a read counter may checked to see if the number of total read operations exceeds (508) a read operation threshold. The number of total read operations may be the total number of read operations performed on the block. The read operation threshold may be selected to be a value low enough read disturb does not occur without being detected. If the read operation threshold is too small, then the read operation may take longer to execute than necessary.

If the number of total read operations does not exceed the read operation threshold, then operations may end. Alternatively, if the number of total read operations exceeds the read operation threshold, then the system may attempt to detect read disturb in the block. To do so, a value read from the memory cell(s) on the proxy word line may be compared (510) with the predetermined value previously stored in the memory cell(s). If a difference between the predetermined value and the value read exceeds a threshold, then read disturb may be detected (512). Alternatively, if the difference fails to exceed the threshold, then read disturb may not be detected (514).

Operations may end by, for example, performing an action in response to detecting or failing to detect read disturb. For example, wear leveling may be performed based on whether read disturb is detected in the block. In another example, if read disturb is not detected, then operations may end by waiting for another operation, at which point the operation may be checked (503) to see if the operation is a read operation.

The system 100 may be implemented in many different ways. Each module, such as the read disturb monitor circuit 106, the read module 212, the read disturb determination module 214, the wear leveling module 210, and the ECC engine 124, may be hardware or a combination of hardware and software. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include memory hardware, such as a portion of RAM or ROM, for example, that comprises instructions executable with a processor such as the controller 102 or other processor to implement one or more of the features of the module. When any one of the modules includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

In some examples, the read proxy voltage may be dynamic and vary over time based on one or more factors, such as the program/erase count of the block, for example. Read disturb may be correlated with the read compare voltage that is applied to the gate (in other words, the gate voltage). If the gate voltage is small (in other words, the gate voltage is less than the read pass voltage), then the resulting read disturb may be limited. However, if the gate voltage is large (in other words, the gate voltage is greater than the read pass voltage), then the resulting read disturb may be more extensive. If gate voltage is very large (in other words, the gate voltage is substantially greater than the read pass voltage), then the resulting read disturb may be more substantial. The correlation between read disturb and the relative value of the read compare voltage compared to the read pass voltage may be determined. Accordingly, the read proxy voltage may be determined as a function of the gate voltage compared to the read pass voltage. Alternatively or in addition, there may be a correlation between read disturb and the read pass voltage. The higher the read pass voltage, the more likely a read will result in a read disturb. In some examples, the read pass voltage may be a function of the program/erase cycles of the block or some other indication of use. Alternatively or in addition, the read proxy voltage may be dynamic based on any other mechanisms that cause read disturb.

Logic implemented as computer executable instructions or as data structures in memory may be stored in a computer readable storage medium. Such logic may be stored on, distributed across, or read from one or more types of computer readable storage media. Examples of the computer readable storage medium may include a hard disk, a floppy disk, a CD-ROM, a flash drive, a cache, volatile memory, non-volatile memory, RAM, flash memory, or any other type of computer readable storage medium or storage media. The computer readable storage medium may include any type of non-transitory computer readable medium, such as a CD-ROM, a volatile memory, a non-volatile memory, ROM, RAM, or any other suitable storage device.

The processing capability of the system 100 may be distributed among multiple entities, such as among multiple processors and memories, optionally including multiple distributed processing systems. Parameters, databases, and other data structures may be separately stored and managed, may be incorporated into a single memory or database, may be logically and physically organized in many different ways, and may implemented with different types of data structures such as linked lists, hash tables, or implicit storage mechanisms. Logic, such as programs or circuitry, may be combined or split among multiple programs, distributed across several memories and processors, and may be implemented in a library, such as a shared library (for example, a dynamic link library (DLL)).

A second action may be said to be "in response to" a first action independent of whether the second action results directly or indirectly from the first action. The second action may occur at a substantially later time than the first action and still be in response to the first action. Similarly, the second action may be said to be in response to the first action even if intervening actions take place between the first action and the second action, and even if one or more of the intervening actions directly cause the second action to be performed. For example, a second action may be in response to a first action if the first action sets a flag and a third action later initiates the second action whenever the flag is set.

The memory device and/or the non-volatile solid state memory may be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions may also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations may be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories may be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the embodiments as described herein and as understood by one of skill in the art.

Furthermore, although specific components are described above, methods, systems, and articles of manufacture described herein may include additional, fewer, or different components. For example, a processor may be implemented as a microprocessor, microcontroller, application specific integrated circuit (ASIC), discrete logic, or a combination of other type of circuits or logic. Similarly, memories may be DRAM, SRAM, Flash or any other type of memory. Flags, data, databases, tables, entities, and other data structures may be separately stored and managed, may be incorporated into a single memory or database, may be distributed, or may be logically and physically organized in many different ways. The components may operate independently or be part of a same program or apparatus. The components may be resident on separate hardware, such as separate removable circuit boards, or share common hardware, such as a same memory and processor for implementing instructions from the memory.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed.

It is intended that the foregoing detailed description be understood as an illustration of selected forms that embodiments may take and not as a definition of all embodiments. Finally, it should be noted that any aspect of any of the embodiments described herein may be used alone or in combination with one another.

While various embodiments have been described, it will be apparent to those of ordinary skill in the art that many more embodiments and implementations are possible. Accordingly, the embodiments described herein are examples, not the only possible embodiments and implementations.

What is claimed is:

1. A memory system comprising:
a non-volatile solid state memory comprising selected memory cells coupled to a selected word line, proxy memory cells coupled to a proxy word line, wherein the selected memory cells are non-adjacent to the proxy memory cells; and
a memory controller configured to:
apply a read proxy voltage to the proxy word line when data is read from the selected memory cells; and
determine a read disturb based on a difference between a predetermined value stored in the proxy memory cells and a value read from the proxy memory cells.

2. The memory system of claim 1, wherein the memory controller is further configured to determine that the read disturb is detected if the difference exceeds a threshold value.

3. The memory system of claim 1, wherein the difference is an error correction code.

4. The memory system of claim 1, wherein the difference is a number of bits that differ between the predetermined value and the value read from the proxy memory cells.

5. The memory system of claim 1, wherein the memory controller is further configured to determine the read disturb based additionally on a program and erase cycle count.

6. The memory system of claim 1, wherein the proxy word line is a last word line in a string to be programmed.

7. The memory system of claim 1, wherein the proxy word line is a dummy word line.

8. The memory system of claim 1, wherein the memory controller is further configured to apply a read pass voltage to control gates of transistors in cells that are adjacent to the selected memory cells when the data is read from the selected memory cells, and wherein the read pass voltage is substantially the same as the read proxy voltage.

9. The memory system of claim 1, wherein the memory controller is further configured to apply a read compare voltage to a control gate of any of the selected memory cells when the data is read from the selected memory cell, wherein the read compare voltage is less than the read proxy voltage.

10. The memory system of claim 1, wherein the memory controller is further configured to apply the read proxy voltage to the selected word line if a block comprising the selected word line is open, but not if the block comprising the selected word line is closed.

11. The memory system of claim 1, wherein the difference between the predetermined value stored in the proxy memory cells and the value read from the proxy memory cells is based on a count made during a wear leveling read scan of a number of zeros stored in the proxy memory cells, wherein the proxy word line is a dummy word line, wherein the predetermined value stored in the proxy memory cells is zero, which resulted from erasure of the proxy memory cells, wherein a first block comprises the selected word line, and wherein the memory controller is further configured to copy data from the first block to a second block that has a same cell level as the first block if the number of zeros exceeds a threshold value, or else to copy the data from the first block to a third block having a higher cell level than the first block.

12. The memory system of claim 1, wherein the difference between the predetermined value stored in the proxy memory cells and the value read from the proxy memory cells is based on a count, which was made prior to a closing of a first block that includes the selected word line, of a number of zeros stored in the proxy memory cells, wherein the proxy word line is a last unprogrammed word line of the first block, wherein the predetermined value is zero and was stored by erasure of the proxy memory cells,
wherein the memory controller is further configured to copy data from the first block to a second block that has a same cell level as the first block if the number of zeros exceeds a threshold value, otherwise to close the first block, wherein the first block is closed if host data is written to the proxy memory cells.

13. The memory system of claim 1, wherein the memory controller is further configured to apply the read proxy voltage even if a block that includes the selected memory cells is closed, wherein the memory controller is further configured to sample, during a wear leveling read scan, the proxy memory cells for error code correction (ECC), wherein the selected memory cells are included in a first block, wherein the memory controller is further configured to copy data from the first block to a second block that has a same cell level as the first block if the ECC exceeds a threshold value, else fold the data from the first block to a third block having a higher cell level than the first block.

14. A memory device comprising:
- a non-volatile solid state memory comprising a selected memory cell coupled to a selected word line, a proxy memory cell coupled to a proxy word line, wherein an unselected memory cell is between the selected memory cell and the proxy memory cell, and the selected memory cell is selected for a read operation, and the proxy memory cell stores a predetermined value instead of host data; and
- a means for determining read disturb configured to determine a read disturb based on a difference between the predetermined value stored in the proxy memory cell and a value read from the proxy memory cell, the value read from proxy memory after the read operation completes.

15. The memory device of claim 14 further comprising a means for reading configured to apply a read proxy voltage to the proxy word line only on border word line reads.

16. The memory device of claim 14 further comprising a means for reading configured to apply a read proxy voltage to the proxy word line during the read operation, wherein the read proxy voltage is greater than or equal to a read pass voltage applied to the unselected memory cell during the read operation.

17. The memory device of claim 14 wherein the non-volatile solid state memory comprises single-level cell memory.

18. The memory device of claim 14 wherein the non-volatile solid state memory comprises triple-level cell memory.

19. The memory device of claim 14 further comprising a means for wear leveling configured to determine when to relocate within single-level cell memory and when to move from single-level cell memory to triple-level cell memory or multi-level cell memory.

* * * * *